US009632141B2

(12) United States Patent
Vahidsafa et al.

(10) Patent No.: US 9,632,141 B2
(45) Date of Patent: Apr. 25, 2017

(54) SIMULTANEOUS TRANSITION TESTING OF DIFFERENT CLOCK DOMAINS IN A DIGITAL INTEGRATED CIRCUIT

(71) Applicant: Oracle International Corporation, Redwood City, CA (US)

(72) Inventors: Ali Vahidsafa, Palo Alto, CA (US); Roger Charles Mistely, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 91 days.

(21) Appl. No.: 14/316,468

(22) Filed: Jun. 26, 2014

(65) Prior Publication Data

US 2015/0377960 A1    Dec. 31, 2015

(51) Int. Cl.
    *G01R 31/3185*    (2006.01)
    *G01R 31/319*    (2006.01)
    *G06F 11/22*    (2006.01)

(52) U.S. Cl.
    CPC ............... *G01R 31/31922* (2013.01); *G01R 31/318552* (2013.01); *G01R 31/318563* (2013.01); *G01R 31/318594* (2013.01); *G06F 11/2236* (2013.01); *G01R 31/31908* (2013.01)

(58) Field of Classification Search
    CPC .... G01R 31/318552; G01R 31/318594; G01R 31/3177; G01R 31/31725; G01R 31/318563; G01R 31/31922
    USPC ........................................................ 714/731
    See application file for complete search history.

(56) References Cited

U.S. PATENT DOCUMENTS

| | | | | |
|---|---|---|---|---|
| 6,966,021 | B2 * | 11/2005 | Rajski | G01R 31/318594 713/503 |
| 7,191,373 | B2 * | 3/2007 | Wang | G01R 31/31704 714/729 |
| 7,954,023 | B2 * | 5/2011 | Otsuga | H03K 19/0016 714/726 |
| 8,074,133 | B2 * | 12/2011 | Ziaja | G01R 31/3016 714/731 |
| 8,386,866 | B2 * | 2/2013 | Chung | G01R 31/318555 714/731 |
| 8,479,068 | B2 * | 7/2013 | Periasamy | G01R 31/318552 714/731 |
| 9,194,916 | B2 * | 11/2015 | Sprague | G01R 31/31922 |
| 2005/0055615 | A1 * | 3/2005 | Agashe | G01R 31/318552 714/727 |

(Continued)

*Primary Examiner* — James C Kerveros
(74) *Attorney, Agent, or Firm* — Polsinelli PC (57) ABSTRACT

Implementations of the present disclosure involve an apparatus and/or method for conducting simultaneous transition testing of different clock domains of a microprocessor design at different frequencies through a controlled order of clock pulses in each domain. In general, a microelectronic design utilizes test control circuitry associated with each clock domain of the design to conduct simultaneous transition testing of the clock domains. The testing control circuitry associated with each clock domain of the microelectronic design further allows for the testing device to delay testing within a particular clock domain. By delaying the testing within a particular clock domain, the testing of the various clock domains can be synchronized. Through these testing procedures, the amount of time required to perform the ATPG testing of a microelectronic design may be greatly reduced.

20 Claims, 5 Drawing Sheets

(56) References Cited

U.S. PATENT DOCUMENTS

| | | | |
|---|---|---|---|
| 2007/0192660 A1* | 8/2007 | Maehara | G01R 31/31858 714/726 |
| 2010/0332932 A1* | 12/2010 | Muraoka | G01R 31/318364 714/744 |
| 2011/0264971 A1* | 10/2011 | Bahl | G01R 31/318594 714/731 |
| 2012/0150473 A1* | 6/2012 | Grise | G01R 31/31726 702/117 |
| 2012/0173943 A1* | 7/2012 | Cesari | G01R 31/318552 714/731 |
| 2014/0164860 A1* | 6/2014 | Kim | G01R 31/31853 714/731 |

* cited by examiner

SIMULTANEOUS TRANSITION TESTING OF DIFFERENT CLOCK DOMAINS IN A DIGITAL INTEGRATED CIRCUIT

FIELD OF THE DISCLOSURE

Aspects of the present invention relate to computing systems and, more particularly, aspects of the present invention involve an apparatus and/or method for conducting simultaneous transition testing of different clock domains of a microprocessor at the target frequency of each clock domain, and with a controlled order of clock pulses in each domain.

BACKGROUND

Computers are ubiquitous in today's society. They come in all different varieties and can be found in places such as automobiles, laptops or home personal computers, banks, personal digital assistants, cell phones, as well as many businesses. As such, it is often desirable to improve the efficiency and comprehensiveness of manufacturing testing of computer components. To ensure fast and reliable operation of a computer, manufacturing testing of each part must include some form of speed testing to show that the component is operating within the specified timing parameters.

One common method of circuit testing is known as Automatic Test Pattern Generation (ATPG). In ATPG testing, an input test pattern is scanned into the logic of a digital circuit, a number of clock pulses are issued to advance the state, then the final state is scanned out and compared to an expected output pattern to determine if the logic of the circuit is operating correctly. Generally, there are two types of ATPG testing performed on computer circuits. The first type of ATPG test, known as stuck-bit testing, issues a single clock pulse before scanning out the state and analyzing the result. This type of test is frequently used to determine manufacturing defects of the logic of the circuit which are speed independent. The second type of ATPG test, known as transition test, issues two or more clock pulses at the expected operating frequency of the circuit. This type of test is used frequently to determine if the circuit operates correctly at the frequency of the clock signal. In other words, at-speed transition-testing determines accuracy of the circuit at the anticipated clock frequency for the circuit.

Many microprocessor designs include various domains within the circuit design that utilize different clock signals. For example, the various cores of a microprocessor design may operate on clock signals with different frequencies. Other clock domains within a microprocessor design may include memory interface circuits, input/output interfaces, and crossbars, among others. Because these components or sections of the circuit design may operate on clock frequencies different from other clock domains within the circuit, testing of such clock domains becomes cumbersome. In particular, it is often the case that each clock domain within the microprocessor design is tested individually to ensure that the proper clock signal and frequency is provided to the clock domain during testing. As should be appreciated, testing each clock domain of the circuit separately may exert a cost on the manufacturing phase in the form of both time and processing power.

It is with these and other issues in mind that various aspects of the present disclosure were developed.

SUMMARY

One implementation of the present disclosure may take the form of a method of automatic test pattern generation (ATPG) testing of a microelectronic circuit. The method may include the operation of generating a test program comprising a plurality of testing instructions to conduct ATPG testing of a plurality of clock domains of the microelectronic circuit, wherein a first clock domain of the plurality of clock domains operates on a first clock signal with a first frequency and a second clock domain of the plurality of clock domains operates on a second clock signal with a second frequency, the first frequency different from the second frequency. Further, the method may include the operation of transmitting a first clock domain testing instruction of the plurality of instructions to a first test control circuit associated with first clock domain and a second clock domain testing instruction of the plurality of instructions to a second test control circuit associated with second clock domain, wherein the first clock domain testing instruction and the second clock domain testing instruction cause the first clock domain and the second clock domain to undergo ATPG testing simultaneously.

Another implementation of the present disclosure may take the form of a multi-threaded processor. The multi-threaded processor may comprise a plurality of clock domains, each clock domain within the plurality comprising one or more test control circuits and an operating clock component, wherein a first clock domain of the plurality of clock domains operates on a first clock signal with a first frequency and a second clock domain of the plurality of clock domains operates on a second clock signal with a second frequency, the first frequency different from the second frequency. The one or more test control circuits of a first clock domain of the plurality of clock domains is configured to receive one or more testing instructions for the first clock domain from a testing device, the one or more testing instructions for the first clock domain configured to cause the operating clock component of the first clock domain to transmit one or more clock pulses in the first clock domain during an automatic test pattern generation (ATPG) testing of the first clock domain. Also, the one or more test control circuits of a second clock domain of the plurality of clock domains is configured to receive one or more testing instructions for the second clock domain from a testing device, the one or more testing instructions for the second clock domain configured to cause the operating clock component of the second clock domain to transmit one or more clock pulses in the second clock domain during a ATPG testing of the second clock domain such that the ATPG testing of the first clock domain and the ATPG testing of the second clock domain occur simultaneously.

Yet another implementation of the present disclosure may take the form of a computing system including a testing device for conducting automatic test pattern generation (ATPG) testing of circuit designs and a microelectronic circuit connected to the testing device. The microelectronic circuit may include a plurality of clock domains, each clock domain within the plurality comprising one or more test control circuits and an operating clock component, wherein a first clock domain of the plurality of clock domains operates on a first clock signal with a first frequency and a second clock domain of the plurality of clock domains operates on a second clock signal with a second frequency, the first frequency different from the second frequency. The one or more test control circuits of a first clock domain of the plurality of clock domains is configured to receive one or more testing instructions for the first clock domain from the testing device, the one or more testing instructions for the first clock domain configured to cause the operating clock component of the first clock domain to transmit one or more clock pulses in the first clock domain during testing of the first clock domain. Also, the one or more test control circuits of a second clock domain of the plurality of clock domains is configured to receive one or more testing instructions for the second clock domain from the testing device, the one or more testing instructions for the second clock domain configured to cause the operating clock component of the second clock domain to transmit one or more clock pulses in the second clock domain during testing of the first clock domain such that ATPG testing of the first clock domain and ATPG testing of the second clock domain occur simultaneously.

DETAILED DESCRIPTION

Implementations of the present disclosure involve an apparatus and/or method for conducting simultaneous transition testing of different clock domains of a microprocessor design at their target frequencies, as well as a controlled order of clock pulses in each domain. In general, the present disclosure includes a microelectronic design that utilizes control circuitry associated with each clock domain of the design to conduct simultaneous transition testing of the clock domains. Previously, testing of separate clock domains of a microelectronic design was conducted sequentially to allow the testing device to reconfigure the clock frequency to match the specific clock domain of the circuit being tested. For the present disclosure, the testing control circuitry associated with each clock domain of the microelectronic design further allows for the testing device to delay testing within a particular clock domain. By delaying the testing within a particular clock domain, the order of testing of the various clock domains can be coordinated. In other words, clock domains that depend upon a result from another clock domain may be delayed through the testing control circuitry of the clock domain to wait until the results from the other clock domain has had time to complete and propagate to the dependent clock domain. Through these testing procedures, the amount of time required to perform the ATPG testing of a microelectronic part may be greatly reduced.

Figure 1:
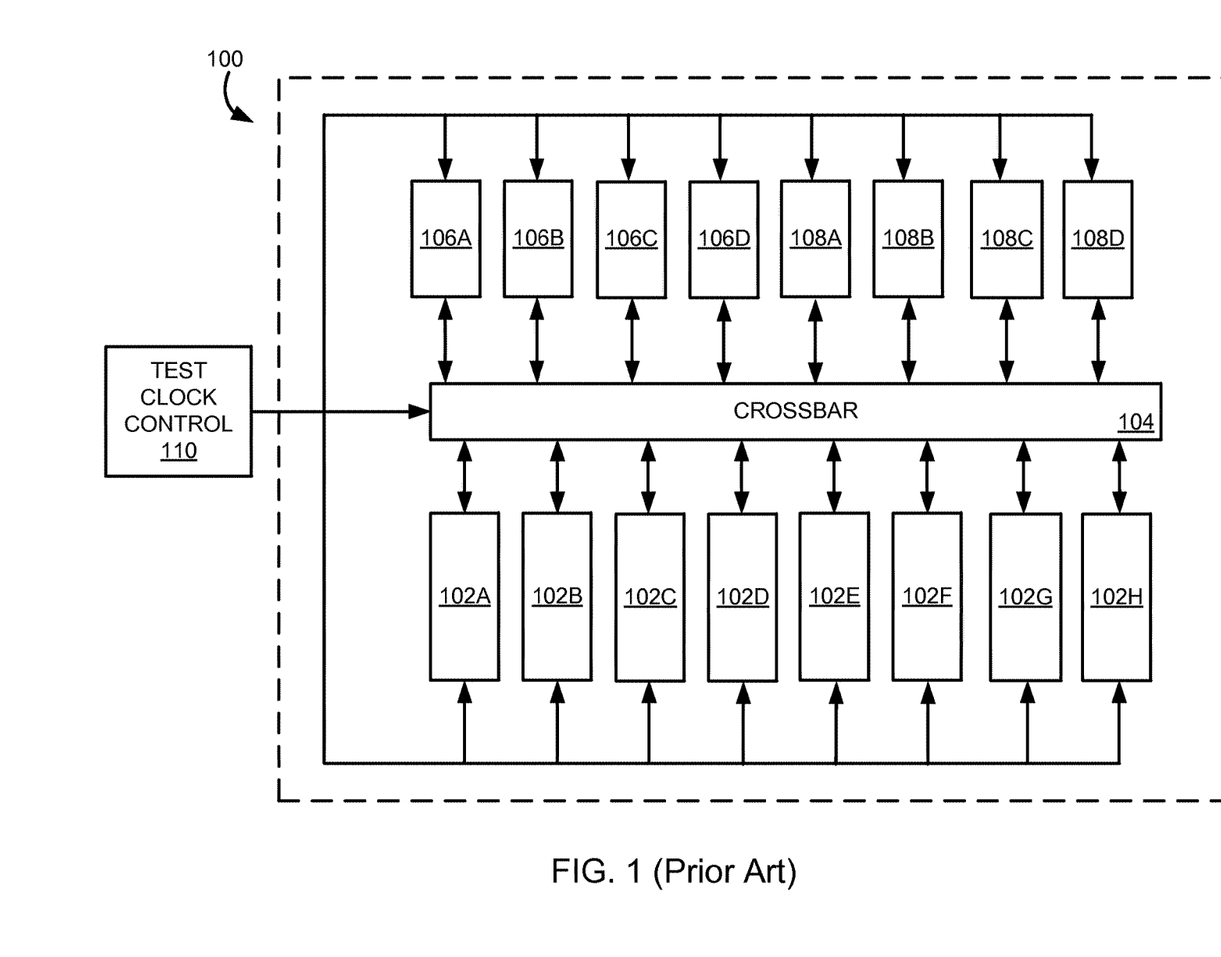
FIG. 1 is a circuit diagram illustrating a prior art example of a test set-up for testing a microprocessor design.

FIG. 1 is a circuit diagram illustrating a prior art example of a test set-up for testing a microelectronic design. In particular, the microelectronic design of FIG. 1 is a portion of a microprocessor design, illustrating several clock domains of the design. For example, the processor 100 of FIG. 1 includes several processor cores 102A-H, a crossbar 104, several memory interfaces 106A-D, several input/output interfaces 108A-D, and the like. Each of the components of the processor 100 may communicate through the crossbar 104 such that data may be provided from one component to another for processing of the data. It should be appreciated that several components of the overall processor 100 are not illustrated in FIG. 1. Rather, the design used herein is to simplify the discussion of the present disclosure.

In general, each of the components of the processor 100 illustrated in FIG. 1 is a clock domain of the design. In other words, although the processor 100 may utilize a global clock signal with a particular frequency, each of the clock domains may operate on a clock frequency that is higher or lower than the global clock frequency, based on the parameters of the overall processor 100 design.

During manufacturing phase of the processor 100, each part may go through a series of tests, such as ATPG-type testing. Typically, such testing is performed by connecting the design to a testing device 110 or testing center. During ATPG testing, the testing device 110 connects to the processor 100 to drive one or more scan chains and control signals to the processor to control the testing of the processor. Further, the testing device 110 may receive one or more scan chains driven by the design during the testing, compare the received value against an expected result and provide the results to a test administrator for analysis. As discussed above, some control signals that are provided by the testing device 110 are clock or clock control signals directed at the various clock domains of the design to control releasing of clock pulses for testing.

Typically, the testing of the clock domains of the processor 100 occurs one at a time. That is, the testing device 110 or test administrator selects which clock domain is to be tested and configures the testing device 110 to provide the control signals to the tested domain. Thus, the testing device 110 may provide an enable signal to the particular clock domain under test to initiate the testing. A scan chain for that domain is also provided. Also, the testing device 110 would provide a clock signal to the domain under test that would approximate the operating frequency of the domain. In other words, during testing of the clock domain, the domain is operated by a clock signal provided by the testing device, rather than the internal clock signal of the domain. The testing clock signal would provide a single clock pulse to the target clock domain for a stuck-bit test of the domain and more than one clock pulses for at-speed testing of the domain. Further, because each of the domains of the processor 100 may be operating on different clock signal frequencies, the clock signal provided from the testing device 110 for a test of one clock domain would typically not be proper for testing of another clock domain.

Figure 2:
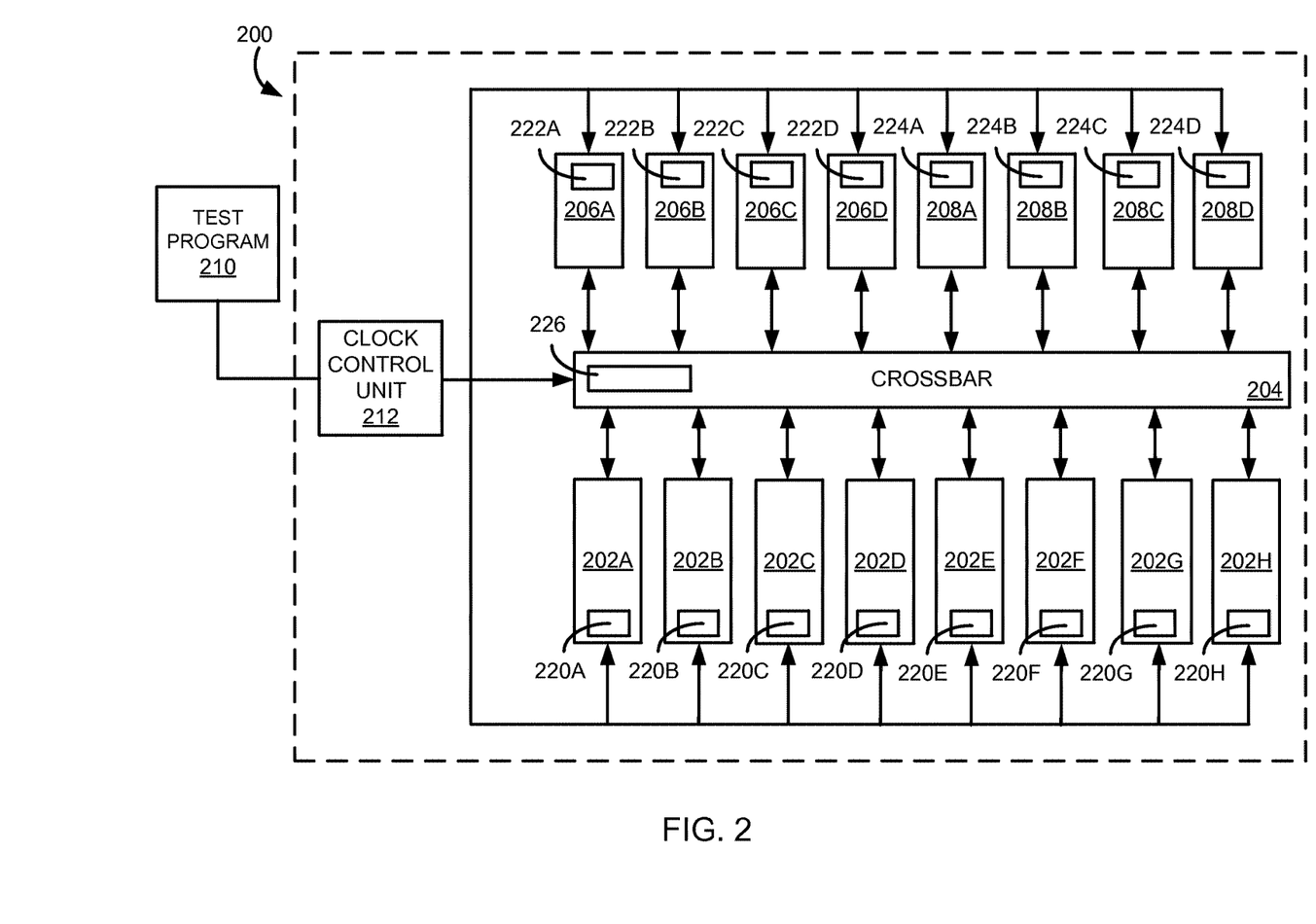
FIG. 2 is a circuit diagram illustrating an example of a test set-up for testing a microprocessor design which may be used in implementing embodiments of the present disclosure.

To address this complication in the testing of microelectronic designs, an alternative testing procedure and microelectronic design is illustrated in FIG. 2. In particular, FIG. 2 is a circuit diagram illustrating an example of a test set-up for testing a microprocessor design which may be used in implementing embodiments of the present disclosure. The circuit design 200 of FIG. 2 includes similar or the same components as the circuit design 100 discussed in FIG. 1. However, the circuit design 200 of FIG. 2 includes one or more control circuits 220A-226 included in the circuit design to facilitate simultaneous testing of the clock domains of the circuit.

In general, the circuit design includes a plurality of processor cores 202A-H. Each of the cores 202A-H may couple to an interconnect network (or "crossbar") 210 for communication and transmission of data to and from other components of the circuit 200. The cores 200A-H may be configured to execute instructions and to process data according to a particular instruction set architecture (ISA). As shown in FIG. 2, each of the cores 200A-H may be configured to operate independently of the others, such that all the cores 200A-H may execute code in parallel. Additionally, in some embodiments each of the cores 200A-H may be configured to execute multiple threads concurrently, where a given thread may include a set of instructions that may execute independently of instructions from another thread. For example, an individual software process executing on the computer system 200, such as an application, may consist of one or more threads that may be scheduled for execution by an operating system. In some implementations, each of the cores 200A-H may be configured to concurrently execute instructions from eight threads, for a total of 64 threads concurrently. In addition, while the present disclosure discusses a multi-core processor, the embodiments described may also be utilized by a single core processor.

The crossbar 210 may be configured to manage data flow between the cores 200A-H one or more other components of the circuit design 200. In some embodiments, the crossbar 210 may include logic (such as multiplexers or a switch fabric, for example) that may allow any core 200A-H to access any other component, and that conversely may allow data to be returned from the component to any core 200A-H. Further, the crossbar 210 may coordinate communication between the cores 200A-H when the cores are operating under different clock signals.

The circuit design 200 may also include other clock domains. For example, the circuit 200 may include one or more memory interfaces 206A-D and one or more input/output (I/O) interfaces 208A-D. The memory interfaces 206A-D may provide access to memory components (not shown) associated with the circuit design 200 to the components of the circuit. Similarly, I/O interfaces 208A-D may provide access to I/O components (not shown) associated with the circuit design 200 to the components of the circuit. It should be appreciated, however, that no one component of the design 200 illustrated in FIG. 2 is necessary for the present disclosure to operate. For example, in some embodiments, the crossbar 204 may be omitted, such as may be the case with a single core processor. Thus, the components of the circuit 200 are used herein to merely illustrate that various components of the circuit may operate on different clock frequencies, creating a plurality of clock domains within the circuit design. Through the present disclosure, the different clock domains of the circuit 200 may be tested simultaneously by a test program 210, discussed in more detail below.

The timing or clock signals within the processor 200 may be provided with a clock control unit (CCU) 212. As shown in FIG. 2, the CCU 212 may be coupled to the cores 200A-H, the crossbar 210 and the other components 206A-D, 208A-D. During operation, the CCU 212 may provide a plurality of timing or clock signals to the various blocks within the circuit 200. Alternatively, each clock domain of the circuit 200 may have a clock generating component that is activated by one or more signals from the CCU 212. For example, the crossbar 204 may operate at a first frequency by a clock generating component within the crossbar. The clock generating component of the crossbar 204 may be activated from an enable signal from the CCU 212.

The actual clock generation circuitry within the CCU 212 or within each clock domain of the circuit 200 may take a variety of physical forms, including in some embodiments, a crystal based oscillator with relatively low phase noise and/or clock jitter. In other embodiments, the clock generation circuitry may be a frequency synthesized signal based on a crystal oscillator signal, such as a phase locked loop (PLL) synthesizer or a delay-locked-loop (DLL) synthesizer or a frequency-locked-loop (FLL). Since the PLL and/or DLL and/or FLL are feedback and control loops that may synthesize a clock signal, there may be a predetermined period of time that elapses before for the PLL and/or DLL and/or FLL "lock" or provide a stable output clock signal to each of the clock domains of the circuit 200.

As mentioned above, the circuit design 200 of FIG. 2 may undergo testing, such as ATPG-type testing, during the manufacturing phase of the circuit. Thus, a testing device or test program 210 as shown in FIG. 2 is connected to the circuit 200 to initiate the testing and obtain the testing results. For example, during ATPG testing, the testing device connects to the design 200 to drive one or more scan chains and control signals to the design to control the testing of the design. Further, the testing device 210 may receive one or more scan chains that are driven by the design during the testing, compare the received value against an expected result and provide the results to a test administrator for analysis. In particular to the circuit 200 of FIG. 2, the tester may also connect to the CCU 212 of the circuit to aid in initiating the clock signals used during testing. Thus, while only shown as being connected to the circuit 200 at the CCU 212, it should be appreciated that the tester may connect to the circuit in several locations, to scan in test values and receive the results of the test. However, for the present description, a test program 210 created and/or executed by the testing device connected to the circuit 200 may communicate with the CCU 212 of the circuit.

The test program 210 may be a software program created by the ATPG testing device connected to the circuit 200 based on one or more test parameters set out by a test moderator. The test program 210 thus controls when and which of the clock domains of the circuit 200 undergo ATPG testing. As discussed above, such testing could only occur on each clock domain individually because the clock signal that operates each domain was supplied by the tester. In the embodiment of the test system illustrated in FIG. 2, however, one or more control circuits 220A-226 associated with the various clock domains of the circuit may be utilized to test each clock domain with the internal clock to each domain. Through this mechanism, the testing of various clock domains of the circuit 200 may be performed simultaneously.

To facilitate the simultaneous ATPG testing of the circuit 200, each clock domain may include a test control circuit. In particular, each core 202A-H may include an associated core test control circuit 220A-H, each memory interface component 222A-D may include an associated memory interface test control circuit 222A-D, each I/O interface 208A-D may include an associated I/O interface test control circuit 224A-D, and the crossbar 204 may include a crossbar test control circuit 226. In general, each clock domain of the circuit 200 may include an associated test control circuit, regardless of the number of clock domains within the circuit. Each test control circuit may include any number of logic components configured to receive signals from the CCU 212 or test program 210 to facilitate testing of the associated clock domain. In another embodiment, the test control circuit may be a software program that includes one or more instructions to facilitate the ATPG testing of the associated clock domain, or a combination of both hardware and software components.

The use of the test control circuits associated with each clock domain of the circuit design 200 provides several advantages over previous ATPG testing schemes. For example, as mentioned above, ATPG testing of a circuit design with multiple clock domains required that each clock domain be tested separately as the frequency of the clock signal provided by the tester to the targeted clock domain may not be proper for other clock domains of the circuit. In contrast, ATPG testing of the circuit design 200 of FIG. 2 utilizes the internal clock signals of each clock domain to conduct the testing. In other words, rather than utilizing the tester to provide a clock signal to a domain under test, each clock domain of the circuit 200 may be tested while operating on the internal clock signal for the domain. This may be accomplished through the use of the control circuits for each clock domain. In particular, the CCU 212, as instructed through the test program 210 of the tester, may provide clock enable signals to any clock domain under test that initiates the clock for each of the targeted clock domains. As such, clock domains operating under different clock signals (or clock signals with different frequencies) can operate simultaneously during testing. Because the tester is not providing the clock signal for the test, but rather each domain is free to operate on the internal clock signal for each domain, such simultaneous testing can occur. The utilization of the clock domain control circuits is further described below with reference to FIG. 3.

In addition to the ability to test multiple clock domains of the circuit simultaneously, the test control circuits of the clock domains also allows for ordering of the testing of the clock domains of the circuit. For example, the CCU 212 may be instructed by the test program 210 to conduct an ATPG test on a particular clock domain and, after a particular delay set by the test program, conduct a test on a second clock domain. Again, the clock domains may be tested utilizing the clock signal particular to each of the clock domains under test. In this manner, testing of the clock domains may be ordered in a particular fashion so as to simulate testing when one clock domain is dependent on results from another clock domain. This can further reduce the testing time required to test the circuit 200 as well as make the test results more accurate by testing clock-domain-crossing paths. Ordered testing of the clock domains of the circuit 200 is described in more detail below with reference to FIG. 4.

Figure 3:
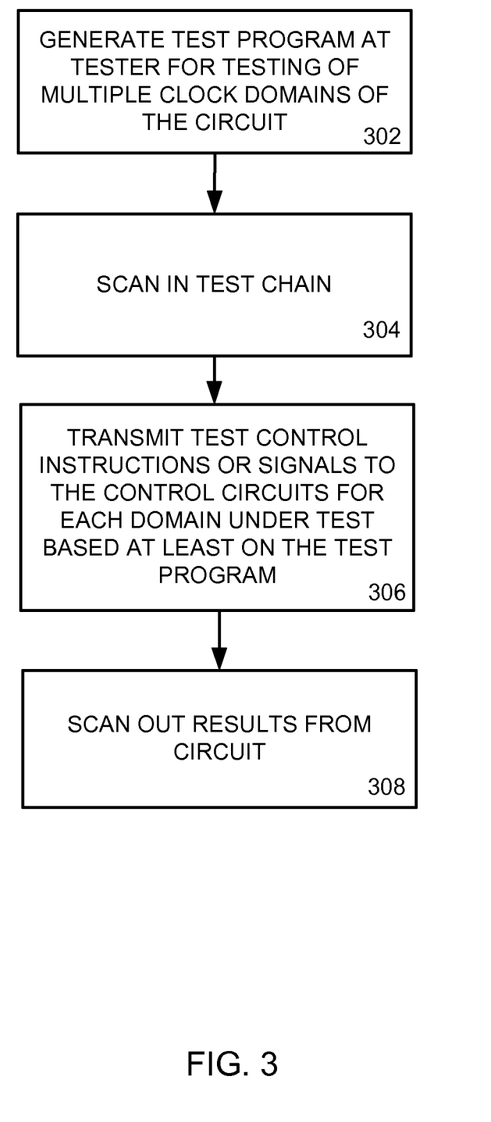
FIG. 3 is a flowchart of a method for utilizing control circuits on a plurality of clock domains of a circuit design for testing of the domains of the design.

As mentioned, FIG. 3 is a flowchart of a method for utilizing control circuits on a plurality of clock domains of a circuit design 200 for simultaneous testing of the domains of the design. The simultaneous testing of multiple clock domains of the circuit 200 may occur because each clock domain under test includes a control circuit that is used by a testing device to activate testing of the clock domains. Thus, the operations of the method of FIG. 3 may be performed by a circuit under test through one or more instructions provided of a test program running on the testing device. Alternatively, the operations may be performed by the testing device itself through one or more connections with the circuit design. Reference is made to the circuit 200 of FIG. 2 during the discussion of the operations of the flowchart of FIG. 3. However, it should be appreciated that the operations discussed herein may apply to any type of microelectronic circuit design with a plurality of clock domains.

In operation 302, a software tool or testing device generates a test program 210 for conducting ATPG testing of one or more clock domains of the circuit 200. In general, the test program 210 includes one or more test instructions applied to the circuit 200 (such as the CCU 212 or one or more of the clock domains of the circuit) to control the testing. Thus, the test program 210 may be executed by the testing device and the one or more test instructions of the test program may be provided to the circuit 200, over a period of time which constitutes the testing time. For example, in operation 304, a test pattern is scanned into one or more clock domains of the circuit 200 under test. The operation of scanning the test pattern into the circuit 200 may occur upon the circuit receiving an instruction from the test program 210 to scan in a provided test pattern. As such, many of the operations described in the method of FIG. 3 may be initiated by instructions provided in the test program 210.

In one embodiment, the test program 210 is created by a software tool, and then loaded into the testing device. In another embodiment, the test program 210 is generated by the testing device based on instructions provided to the testing device by a test administrator. In this manner, the test administrator determines the proper order and parameters of the ATPG test of the circuit 200 and provides that information to the testing device. The testing device may then compile the test parameters into a series of instructions that comprises the test program 210. In a similar manner, the test program 210 may be generated directly by the testing device based on one or more measured parameters of the circuit 200 under test.

Once the test program is generated and the test pattern is scanned into the circuit 200, simultaneous testing of multiple clock domains of the circuit may occur in operation 306. Similar to the scanning in of the test pattern, simultaneous testing of the clock domains may be initiated or started based on one or more test instructions applied to the circuit 200 from the test program 210. For example, the test program 210 may include an identification of the clock domains to be tested and provide such an indication to the CCU 212. The CCU 212 may then provide start signals to the targeted clock domains to begin the testing at those domains. In one embodiment, the start signals initiate a clock signal within the respective clock domains to conduct the ATPG testing. Thus, the various clock domains under test may be tested under the internal clock to that domain. Further, the clock domains under test may operate under different clock frequencies, such that a first clock domain may be tested with a first clock frequency and a second clock domain may be tested with a second clock frequency different from the first. Also, these tests of the different clock domains may occur at the same time based on the start test signal from the CCU 212.

In another embodiment, the testing device may connect to the various components of the circuit 200 to access the test control circuits for each domain. For example, the testing device may connect to the test control circuit 220A of a first clock domain 202A of the circuit 200 and to the test control circuit 222A of a second clock domain 206A. The testing device may then execute a test program 210 that transmits control signals to the test control circuits within the clock domains to initiate testing of the clock domains. Thus, the testing program 210 may provide a start signal to test control circuit 220A of the first clock domain 202A and a start signal to test control circuit 222A of the second clock domain 206A, where the start signals begin the testing of the clock domains. Similar to the embodiment described above, clock domains under test may operate under different clock frequencies, such that the first clock domain 202A may be tested with a first clock frequency and a second clock domain 206A may be tested with a second clock frequency different than the first. Further, because each clock domain is tested based on the clock signal internal to each domain, the test program 210 does not need to provide the various clock signals to the clock domains under test. Rather, the test program 210 simply initiates the clock signal within each domain to conduct the test.

The test control signals provided by the test program 210 may be utilized to conduct stuck-bit testing and at-speed testing of one or more of the clock domains of the circuit 200. In particular, the test program 210 may provide test instructions to the test control circuits of the clock domains to release one clock pulse of the clock signal of the clock domain. For example, the test program 210 may include a signal or instruction to the circuit 200 (such as to the CCU 212) that configures the test control circuit 220A of a core 202A of the circuit to release a single clock pulse from the internal clock signal generator of the core. In this manner, stuck-bit testing of the core 202A of the circuit 200 may be conducted. In a similar manner, the test program 210 may also conduct stuck-bit testing of an I/O interface component 208A of the circuit 200 by instructing the test control circuit 224A associated with the I/O interface component to release a single test pulse from the internal clock signal generator of the I/O interface component. Thus, the stuck-bit testing of the core 202A and the I/O interface component 208A of the circuit may be conducted simultaneously by providing the control signals to the components.

At-speed testing may occur in a similar manner. For example, the test program 210 may provide test instructions to the circuit 200 that causes a clock domain of the circuit to release more than one clock pulse to the associated clock domain. With multiple clock pulses of the clock signal of the clock domain, at-speed testing of the domain may occur. Also similar to the stuck-bit testing, at-speed testing may occur on multiple clock domains of the circuit 200 at the same time as each domain is tested based on the clock signal internal to the clock domains.

Once the ATPG testing of one or more clock domains of the circuit 200 has occurred, the resulting data pattern may be scanned out in operation 308. In particular, the test program 210 or testing device may receive a scan out signal from the circuit 200 to obtain the results of the test. Although not discussed further herein, the test device may also analyze the resulting pattern to determine the correctness of the circuit design 200, including whether the circuit 200 is operating properly under the clock signals of the circuit. Also, because each clock domain is tested while operating based on the internal clock signal associated with the clock domains, the test results may be more accurate than results obtained from tests operating on a clock signal provided by the testing device.

Another feature provided through the test control circuits of the circuit 200 is the ability to perform ordered testing of the clock domains to account for one or more dependencies between the different domains. As mentioned above, previous testing schemes only allow for testing of one clock domain of a circuit at a time. Thus, it was difficult to perform at-speed testing when one clock domain was dependent on data from another clock domain. However, through the use of the test control circuits of the clock domains, at-speed testing between clock domains of the circuit 200 may be performed by providing delays between releasing of pulses in different clock domains.

Figure 4:
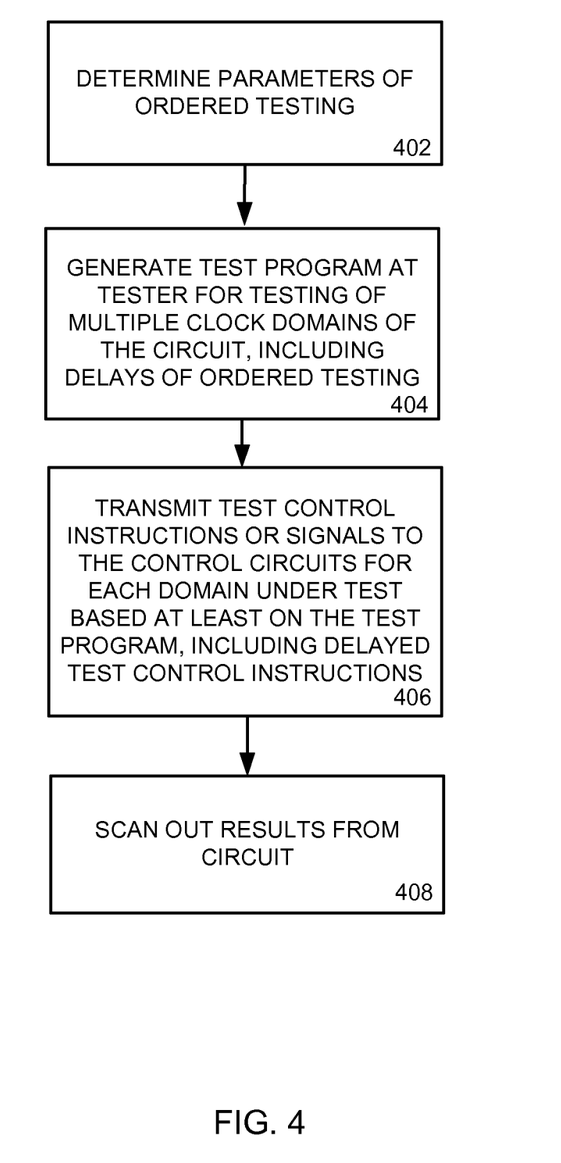
FIG. 4 is a flowchart of a method for utilizing control circuits on a plurality of clock domains of a circuit design to order the testing of the domains of the design.

In particular, FIG. 4 is a flowchart of a method for utilizing control circuits on a plurality of clock domains of a circuit design to order the testing of the domains of the design. Similar to FIG. 3, the operations of the method of FIG. 4 may be performed by a circuit under test through one or more test instructions provided of a test program 210 executing on the testing device. Alternatively, the operations may be performed by the testing device itself through one or more connections with the circuit design. Reference is made to the circuit 200 of FIG. 2 during the discussion of the operations of the flowchart of FIG. 4. However, it should be appreciated that the operations discussed herein may apply to any type of microelectronic circuit design with a plurality of clock domains.

Beginning in operation 402, the testing device or test administrator determines the parameters of the ordered testing. In particular, the parameters of the ordered test determine which clock domains are to be tested and the order in which the clock pulses of the clock domains should occur. For example, an ordered test of the circuit 200 may include a core 202A of the circuit and the crossbar 204. In the desired ordered test, the crossbar 204 receives data from the core 202A after the core has been clocked. Thus, for this particular ordered test, the core 202A clock domain is clocked prior to the crossbar 204 clock domain of the circuit 200. It is of course possible to arrange the control instructions such that crossbar 204 is clocked first and core 202A is clocked second, allowing testing of the path from crossbar 204 to the core 202A

Further, the testing device may account for the amount of time needed to conduct the tests on the clock domains. Continuing the above example, the testing device may determine the length of time needed for the core 202A to perform the at-speed test before the data to be transmitted to the crossbar 204 is ready. Thus, the testing device may account for the frequency of the clock signal of the core 202A, as well as the number of clock cycles to be used to test the core. This information may be used by the testing device to determine how much to delay the testing of the crossbar 204 once testing of the domains has begun.

With this information, the testing device may generate a testing program 210 to perform the ordered testing of the clock domains in operation 404, including one or more delay instructions to delay initiating testing in the particular domains to ensure that the data is ready for the dependent clock domains. In operation 406, the test controls or test instructions are transmitted to the circuit 200 under test to perform the ordered testing. In particular, the testing program 210 may include instructions to begin a test at a first clock domain of the circuit 200 (such as core 202A) and, after a set delay determined by the testing program based on how long testing should occur on the first clock domain, instructions may be transmitted to begin a test at a second clock domain (such as a crossbar 204). In this manner, the testing program 210 may control an ordered test of the clock domains that allows for data to be tested at the first clock domain and then transmitted to a second clock domain for testing at the second clock domain. In addition, this ordered testing may occur at-speed to obtain more accurate testing results of the ATPG testing of the circuit.

In an another embodiment, the testing program 210 may provide the testing instructions to each clock domain under test with one or more of clock domains receiving testing instructions that includes the delay instruction discussed above. In this example, testing of the clock domains begins at the same time by each clock domain executing the transmitted test instructions. However, execution of the delay instruction may cause the clock signals for one or more of the clock domains to start after the testing has begun. In other words, although all or some of the clock domains begin testing at the same time, the delay instruction effectively pauses the clock signal for the associated clock domain from being transmitted for the specified amount of time. In this manner, the delay signal allows for ordered testing of the clock domains by delaying the beginning of the clock signals for the domains from the start point of the overall testing of the circuit. The length of the delay provided to one or more of the clock domains may be related to an amount of time for an associated clock domain to provide data to the delayed clock domain, similar to the embodiment described above.

Also, such ordered testing may occur for any number of clock domains of the circuit 200. Thus, three or more clock domains may also be ordered in a test. In addition, the testing program 210 may be configured to perform both ordered testing and testing of a single clock domain simultaneously to test more of the circuit 200 at a faster rate. Further, the ordered test may include aspects of both stuck-bit testing and at-speed testing of the clock domains. Upon completion of the ordered testing, the resulting data pattern may be scanned out in operation 408 and analyzed by the testing device.

Through the system and operations described herein, simultaneous transition testing of different clock domains of a microprocessor design at different frequencies through a controlled order of clock pulses in each domain may be conducted. This may be accomplished by utilizing control circuitry associated with each clock domain of the design to conduct simultaneous and/or ordered transition testing of the clock domains. Through these testing procedures, the amount of time required to perform the ATPG testing of a microelectronic design may be greatly reduced, and amount of coverage increased.

Figure 5:
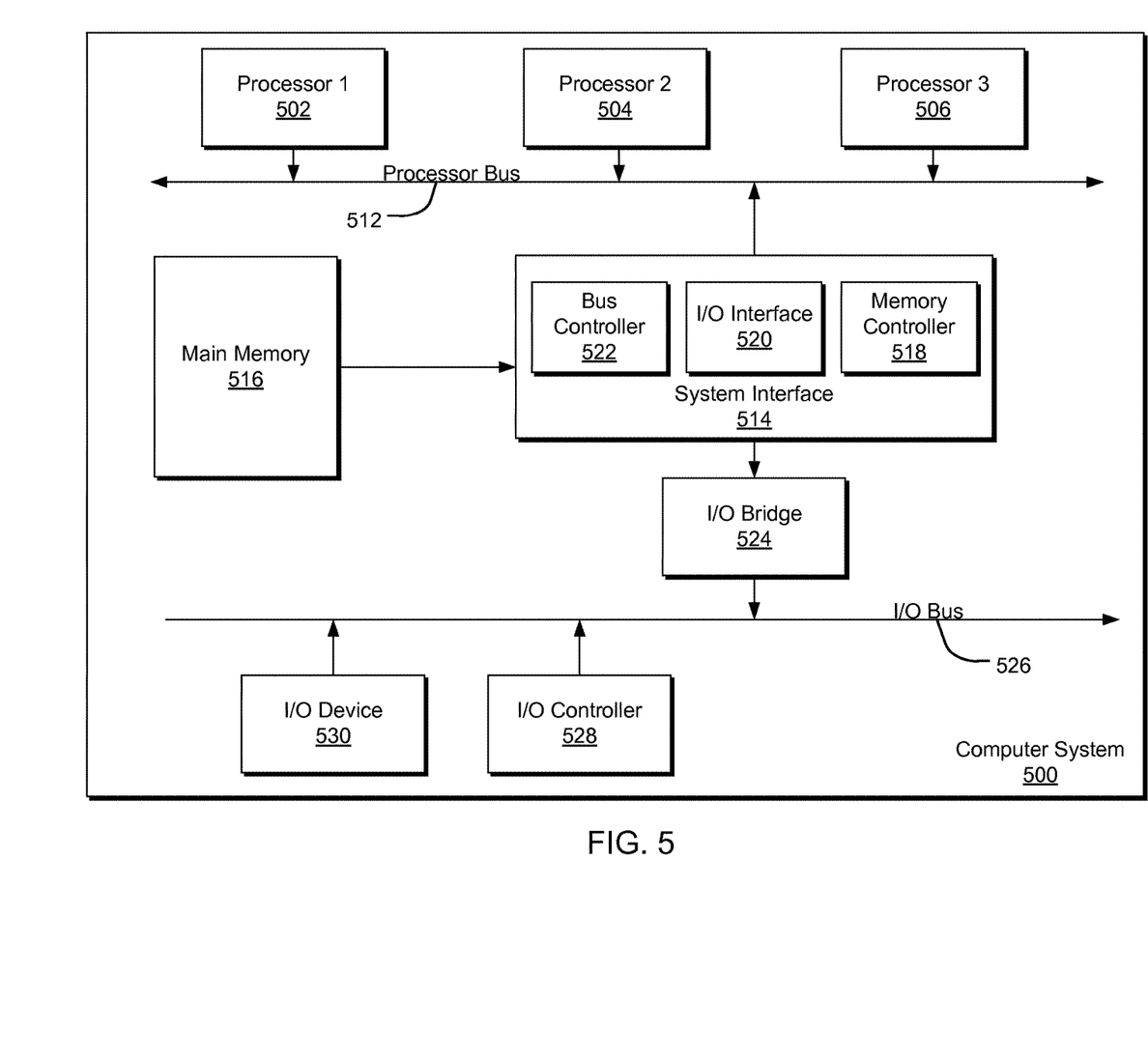
FIG. 5 is a block diagram illustrating an example of a computing system which may be used in implementing embodiments of the present disclosure.

FIG. 5 is a block diagram illustrating an example of a computing device or computer system 500 which may be used in implementing the embodiments of the ATPG testing schemes of a circuit design disclosed above. For example, the testing device described above for conducting testing on a circuit may be similar to the computing device of FIG. 5. The computer system (system) includes one or more processors 502-506. Processors 502-506 may include one or more internal levels of cache (not shown) and a bus controller or bus interface unit to direct interaction with the processor bus 512. Processor bus 512, also known as the host bus or the front side bus, may be used to couple the processors 502-506 with the system interface 514. System interface 514 may be connected to the processor bus 512 to interface other components of the system 500 with the processor bus 512. For example, system interface 514 may include a memory controller 518 for interfacing a main memory 516 with the processor bus 512. The main memory 516 typically includes one or more memory cards and a control circuit (not shown). System interface 514 may also include an input/output (I/O) interface 520 to interface one or more I/O bridges or I/O devices with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506. Another type of user input device includes cursor control, such as a mouse, a trackball, or cursor direction keys for communicating direction information and command selections to the processors 502-506 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506. Main memory 516 also may be used for storing temporary variables or other intermediate information during execution of instructions by the processors 502-506. System 500 may include a read only memory (ROM) and/or other static storage device coupled to the processor bus 512 for storing static information and instructions for the processors 502-506. The system set forth in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 516. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

It should be noted that the flowcharts of FIGS. 3 and 4 are illustrative only. Alternative embodiments of the present invention may add operations, omit operations, or change the order of operations without affecting the spirit and scope of the present invention.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A method of automatic test pattern generation (ATPG) testing of a microelectronic circuit, the method comprising:
    generating a test program comprising a plurality of instructions to conduct ATPG testing of a plurality of clock domains of the microelectronic circuit, wherein a first clock domain of the plurality of clock domains operates on a first clock signal with a first frequency and a second clock domain of the plurality of clock domains operates on a second clock signal with a second frequency, the first frequency different from the second frequency; and transmitting a first clock domain testing instruction of the plurality of instructions from a clock control unit of the microelectronic circuit receiving the test program to a first test control circuit associated with the first clock domain, the first clock domain testing instruction comprising a first clock enable signal that initiates the first clock signal of a first clock domain component; and transmitting a second clock domain testing instruction of the plurality of instructions from the clock control unit of the microelectronic circuit receiving the test program to a second test control circuit associated with the second clock domain, the second clock domain testing instruction comprising a second clock enable signal that initiates a second clock signal of the second clock domain component, wherein the first clock domain testing instruction causes the first clock domain to undergo ATPG testing at the first frequency and the second clock domain testing instruction causes the second clock domain to begin ATPG testing at the second frequency simultaneously with the first clock domain ATPG testing.

2. The method of claim 1 wherein the first clock enable signal is configured to cause a release of one clock pulse of a first clock domain clock component for stuck-bit ATPG testing of the first clock domain.

3. The method of claim 1 wherein the second clock enable signal is configured to cause a release of one clock pulse of a second clock domain clock component for stuck-bit ATPG testing of the second clock domain.

4. The method of claim 1 wherein the first clock enable signal is configured to cause a release of more than one clock pulse of a first clock domain clock component for at-speed ATPG testing of the first clock domain.

5. The method of claim 1 wherein the second clock enable signal is configured to cause a release of more than one clock pulse of a second clock domain clock component for at-speed ATPG testing of the second clock domain.

6. The method of claim 1 further comprising:
transmitting a third clock domain testing instruction of the plurality of instructions from the clock control unit of the microelectronic circuit to a third test control circuit associated with a third clock domain of the plurality of clock domains of the microelectronic circuit, wherein the third clock domain testing instruction comprises a third clock enable signal configured to cause a release of one or more clock pulses of a third clock domain clock component and a delay instruction configured to delay execution of the third clock enable signal for a time period.

7. The method of claim 6 wherein the time period of the delay instruction is related to the first frequency of the first clock signal of the first clock domain of the plurality of clock domains.

8. The method of claim 6 wherein the delay instruction orders testing of the third clock domain of the plurality of clock domains of the microelectronic circuit to occur after one or more data results from the first clock domain in response to the first clock domain testing instruction propagate to the third clock domain.

9. A multi-threaded processor, comprising:
a plurality of clock domains, each clock domain within the plurality of clock domains comprising one or more test control circuits and an operating clock component, wherein a first clock domain of the plurality of clock domains operates on a first clock signal with a first frequency and a second clock domain of the plurality of clock domains operates on a second clock signal with a second frequency, the first frequency different from the second frequency; and a clock control unit receiving a testing procedure from a testing device and transmitting a first clock enable instruction to the first clock domain and a second clock enable instruction to the second clock domain;

wherein the one or more test control circuits of the first clock domain of the plurality of clock domains are configured to cause the operating clock component of the first clock domain to transmit one or more clock pulses in the first clock domain during an automatic test pattern generation (ATPG) testing of the first clock domain in response to the first clock enable instruction; and wherein the one or more test control circuits of the second clock domain of the plurality of clock domains are configured to cause the operating clock component of the second clock domain to transmit one or more clock pulses in the second clock domain during a ATPG testing of the second clock domain in response to the second clock enable instruction such that the ATPG testing of the first clock domain and the ATPG testing of the second clock domain begin simultaneously.

10. The multi-threaded processor of claim 9 wherein a processing core of the multi-threaded processor operates in the first clock domain of the plurality of clock domains.

11. The multi-threaded processor of claim 9 wherein a memory interface component of the multi-threaded processor operates in the first clock domain of the plurality of clock domains.

12. The multi-threaded processor of claim 9 wherein the first clock enable instruction for the first clock domain is configured to cause the operating clock component of the first clock domain to transmit only one clock pulses in the first clock domain for stuck-bit ATPG testing of the first clock domain.

13. The multi-threaded processor of claim 9 wherein the second clock enable instruction for the second clock domain is configured to cause the operating clock component of the second clock domain to transmit only one clock pulses in the second clock domain for stuck-bit ATPG testing of the second clock domain.

14. The multi-threaded processor of claim 9 wherein the first clock enable instruction for the first clock domain is configured to cause the operating clock component of the first clock domain to transmit more than one clock pulse in the first clock domain for at-speed ATPG testing of the first clock domain.

15. The multi-threaded processor of claim 9 wherein the second clock enable instruction for the second clock domain is configured to cause the operating clock component of the second clock domain to transmit more than one clock pulse in the second clock domain for at-speed ATPG testing of the second clock domain.

16. A computer system, comprising:
a testing device for conducting automatic test pattern generation (ATPG) testing of circuit designs; and
a microelectronic circuit coupled to the testing device, the microelectronic circuit comprising:
a plurality of clock domains, each clock domain within the plurality of clock domains comprising one or more test control circuits and an operating clock component, wherein a first clock domain of the plurality of clock domains operates on a first clock signal with a first frequency and a second clock domain of the plurality of clock domains operates on a second clock signal with a second frequency, the first frequency different from the second frequency; and a clock control unit receiving a testing procedure from the testing device and transmitting a first clock enable instruction to the first clock domain and a second clock enable instruction to the second clock domain;

wherein the one or more test control circuits of a first clock domain of the plurality of clock domains are configured to receive the first clock enable instruction for the first clock domain from the clock control unit, the first clock enable instruction for the first clock domain configured to cause the operating clock component of the first clock domain to transmit one or more clock pulses in the first clock domain during testing of the first clock domain; and wherein the one or more test control circuits of a second clock domain of the plurality of clock domains are configured to receive the second clock enable instruction for the second clock domain from the clock control unit, the second clock enable instruction for the second clock domain configured to cause the operating clock component of the second clock domain to transmit one or more clock pulses in the second clock domain during testing of the first clock domain such that ATPG testing of the first clock domain and ATPG testing of the second clock domain begin simultaneously.

17. The computer system of claim 16 wherein the testing device generates a test program comprising the first clock enable instruction for the first clock domain and the second clock enable instruction of the second clock domain to conduct the ATPG testing of the microelectronic circuit.

18. The computer system of claim 17 wherein the first clock enable instruction for the first clock domain is configured to cause the operating clock component of the first clock domain to transmit only one clock pulses in the first clock domain for stuck-bit ATPG testing of the first clock domain.

19. The computer system of claim 17 wherein the second clock enable instruction for the second clock domain is configured to cause the operating clock component of the second clock domain to transmit more than one clock pulse in the second clock domain for at-speed ATPG testing of the second clock domain.

20. The computer system of claim 16 wherein one or more test control circuits of a third clock domain of the plurality of clock domains is configured to receive a third clock enable instruction for the third clock domain and a delay instruction from the clock control unit, the third clock enable instruction for the third clock domain configured to cause the operating clock component of the third clock domain to transmit one or more clock pulses in the third clock domain during testing of the third clock domain and the delay instruction configured to delay execution of the third clock enable instruction for a time period, wherein the delay instruction orders testing of the third clock domain to occur after one or more data results from the first clock domain propagate to the third clock domain.

* * * * *

UNITED STATES PATENT AND TRADEMARK OFFICE
CERTIFICATE OF CORRECTION

PATENT NO. : 9,632,141 B2
APPLICATION NO. : 14/316468
DATED : April 25, 2017
INVENTOR(S) : Vahidsafa et al.

It is certified that error appears in the above-identified patent and that said Letters Patent is hereby corrected as shown below:

In the Specification

In Column 10, Line 22, after "202A" insert -- . --.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*